United States Patent
Tsai (10) Patent No.: US 11,194,245 B2
(45) Date of Patent: Dec. 7, 2021

(54) METHOD OF MANUFACTURING PHASE-SHIFTING PHOTOMASK

(71) Applicant: Powerchip Semiconductor Manufacturing Corporation, Hsinchu (TW)

(72) Inventor: Jia-Horng Tsai, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 59 days.

(21) Appl. No.: 16/842,776

(22) Filed: Apr. 8, 2020

(65) Prior Publication Data

US 2021/0255537 A1 Aug. 19, 2021

(30) Foreign Application Priority Data

Feb. 14, 2020 (TW) ................................. 109104628

(51) Int. Cl.
*G03F 1/26* (2012.01)
(52) U.S. Cl.
CPC ...................... *G03F 1/26* (2013.01)
(58) Field of Classification Search
None
See application file for complete search history.

(56) References Cited

U.S. PATENT DOCUMENTS

| | | | |
|---|---|---|---|
| 5,824,439 A * | 10/1998 | Lee | G03F 1/29 430/5 |
| 2002/0061452 A1* | 5/2002 | Nozawa | G03F 1/54 430/5 |
| 2005/0136668 A1* | 6/2005 | Yotsuya | C23C 14/042 438/689 |

(Continued)

FOREIGN PATENT DOCUMENTS

| CN | 104020639 | 9/2014 |
|---|---|---|
| CN | 106597803 | 4/2017 |

(Continued)

OTHER PUBLICATIONS

Machine translation of JP 2015-049282 (2015).*

(Continued)

*Primary Examiner* — Martin J Angebranndt
(74) *Attorney, Agent, or Firm* — JCIPRNET (57) ABSTRACT

The present disclosure provides a method of manufacturing a phase-shifting photomask, which includes following steps. A mask pattern provides on a transparent substrate and includes a first layer photomask pattern including a phase-shifting layer and a light shielding layer sequentially stacked on the transparent substrate and a second layer photomask pattern stacked on the transparent substrate in sequence. A thermal oxidation process is performed on the second layer photomask pattern to form a thermal oxide layer and a hard-shielding layer pattern exposed a portion of a top surface of the light shielding layer, and the thermal oxide layer covers the hard-shielding layer pattern and the portion (Continued)

of the top surface of the light shielding layer. The thermal oxide layer is removed. A portion of the light shielding layer is removed by using the hard-shielding layer pattern as a mask to form a patterned light shielding layer exposed the phase-shifting layer.

20 Claims, 10 Drawing Sheets

(56) References Cited

U.S. PATENT DOCUMENTS

| | | | |
|---|---|---|---|
| 2011/0126892 A1* | 6/2011 | Putnam | H01L 31/068 136/255 |
| 2016/0291453 A1* | 10/2016 | Inazuki | G03F 1/26 |
| 2017/0123305 A1* | 5/2017 | Watanabe | G03F 1/32 |
| 2018/0335692 A1* | 11/2018 | Nam | G03F 1/80 |
| 2019/0101818 A1 | 4/2019 | Lin | |
| 2019/0146327 A1 | 5/2019 | Nozawa et al. | |
| 2019/0187551 A1 | 6/2019 | Iwashita et al. | |

FOREIGN PATENT DOCUMENTS

| | | | |
|---|---|---|---|
| JP | 08-297357 | * | 11/1986 |
| JP | 04-006557 | * | 1/1992 |
| JP | 04-284618 | * | 10/1992 |
| JP | 06-138637 | * | 5/1994 |
| JP | 07-056319 | * | 3/1995 |
| JP | 09-204036 | * | 8/1997 |
| JP | 10-069060 | * | 3/1998 |
| JP | 2015-049282 | * | 3/2015 |
| JP | 2015062049 | | 4/2015 |
| TW | 201702729 | | 1/2017 |
| TW | 201831986 | | 9/2018 |
| WO | 2018230233 | | 12/2018 |

OTHER PUBLICATIONS

Machine translation of JP 10-069060 ( 1998 ).*
Machine translation of JP 04-006557 (1992 ).*
Machine translation of JP 04-284618 ( 1992 ).*
"Office Action of Taiwan Counterpart Application", dated May 26, 2020, p. 1-p. 5.

* cited by examiner

METHOD OF MANUFACTURING PHASE-SHIFTING PHOTOMASK

CROSS-REFERENCE TO RELATED APPLICATION

This application claims the priority benefit of Taiwan application serial no. 109104628, filed on Feb. 14, 2020. The entirety of the above-mentioned patent application is hereby incorporated by reference herein and made a part of this specification.

BACKGROUND OF THE INVENTION

1. Field of the Invention

The invention relates to a method of manufacturing a mask pattern, and more particularly, to a method of manufacturing a phase-shifting photomask.

2. Description of Related Art

The high integration of large-scale integrated circuits usually accompanies the demand for fine circuit patterns, and with the demand for fine circuit patterns, the high fineness of semiconductor processing technology has gradually received attention. Therefore, photolithographic processes have been developed by using a phase-shifting photomask to improve the resolution of the exposure. However, the process of forming the phase-shifting photomask is not stable, it is difficult to apply the phase-shifting photomask to the present processes practically.

SUMMARY OF THE INVENTION

The invention provides a method of manufacturing a phase-shifting photomask having a good stability.

An embodiment of the invention provides a method of manufacturing a phase-shifting photomask, the method includes following steps. A mask pattern provides on a transparent substrate and includes a first layer photomask pattern including a phase-shifting layer and a light shielding layer sequentially stacked on the transparent substrate and a second layer photomask pattern stacked on the transparent substrate in sequence. A thermal oxidation process is performed on the second layer photomask pattern to form a thermal oxide layer and a hard-shielding layer pattern exposed a portion of a top surface of the light shielding layer, and the thermal oxide layer covers the surface of the hard-shielding layer pattern and the portion of the top surface of the light shielding layer. The thermal oxide layer is removed. A portion of the light shielding layer is removed by using the hard-shielding layer pattern as a mask to form a patterned light shielding layer exposed the phase-shifting layer. The hard-shielding layer pattern is removed.

According to an embodiment of the invention, the sidewall of the first layer photomask pattern is coplanar with the sidewall of the second layer photomask pattern.

According to an embodiment of the invention, the sidewall of the first layer photomask pattern is at a first distance from the sidewall of the hard-shielding layer pattern.

According to an embodiment of the invention, the sidewall of the thermal oxide layer is at a second distance from the sidewall of the first layer photomask pattern.

According to an embodiment of the invention, the sum of the first distance and the second distance is approximately equal to a thickness of the thermal oxide layer.

According to an embodiment of the invention, an etching selectivity ratio of the thermal oxide layer to the hard-shielding layer pattern is larger than 10.

According to an embodiment of the invention, the material of the hard-shielding layer pattern includes silicon, and the material of the thermal oxide layer includes silicon oxide.

According to an embodiment of the invention, the steps of providing the mask pattern on the transparent substrate are as follows. A blank mask including is provided on the transparent substrate, wherein the blank mask includes a phase-shifting material layer and a light shielding material layer stacked on the transparent substrate in sequence. The second layer photomask pattern is formed on the light shielding material layer. The blank mask is patterned by using the second layer photomask pattern as a mask to form the first layer photomask pattern exposed the transparent substrate.

According to an embodiment of the invention, the light transmittance of the phase-shifting layer is ranging from about 6% to 30%.

According to an embodiment of the invention, the method of manufacturing the phase-shifting photomask further includes following steps. A photoresist pattern is formed on the transparent substrate before removing the thermal oxide layer, wherein the photoresist pattern covers the transparent substrate exposed by the first layer photomask pattern. The photoresist pattern is removed after the thermal oxide layer is removed.

According to an embodiment of the invention, the steps of forming the photoresist pattern are as follows. A photoresist layer covered the thermal oxide layer is formed on the transparent substrate, wherein the photoresist layer has a first region covered the transparent substrate exposed by the first layer photomask pattern and a second region disposed on the first region and covered the top surface and sidewalls of the thermal oxide layer. The second region of the photoresist layer is removed to form the photoresist pattern.

According to an embodiment of the invention, the photoresist pattern is removed after the patterned light shielding layer is formed.

Another embodiment of the invention provides a method of manufacturing a phase-shifting photomask, the method includes following steps. A blank mask is provided on a transparent substrate, wherein the blank mask includes a phase-shifting material layer and a light shielding material layer stacked on the transparent substrate in sequence. A second layer photomask pattern is formed on the blank mask. A thermal oxidation process is performed on the second layer photomask pattern and the light shielding material layer to form a hard-shielding layer pattern, a first thermal oxide layer formed on the top surface and sidewalls of the hard-shielding layer pattern, and a second thermal oxide layer formed on the light shielding material layer exposed by the second layer photomask pattern. The second thermal oxide layer and a portion of the light shielding material layer are removed to form a light shielding layer exposed the phase-shifting material layer. The first thermal oxide layer is removed. A portion of the phase-shifting material layer is removed by using the light shielding layer as a mask to form a phase-shifting layer exposed the transparent substrate. A portion of the light shielding layer is removed by using the hard-shielding layer pattern as a mask to form a patterned light shielding layer exposed the phase-shifting layer. The hard-shielding layer pattern is removed.

According to another embodiment of the invention, the sidewall of the light shielding layer is coplanar with the sidewall of the phase-shifting layer.

According to another embodiment of the invention, the sidewall of the light shielding layer is coplanar with the sidewall of the thermal oxide layer.

According to another embodiment of the invention, the sidewall of the hard-shielding layer pattern is at a first distance from the sidewall of the light shielding layer.

According to another embodiment of the invention, the first distance is approximately equal to a thickness of the first thermal oxide layer.

According to another embodiment of the invention, the sidewall of the light shielding layer is at a first distance from the sidewall of the hard-shielding layer pattern.

According to another embodiment of the invention, the sidewall of the first thermal oxide layer is at a second distance from the sidewall of the light shielding layer.

According to another embodiment of the invention, the sum of the first distance and the second distance is approximately equal to a thickness of the first thermal oxide layer.

Based on the above, since the hard-shielding layer pattern is formed by performing the thermal oxidation process on the second layer photomask pattern in the present invention of the method of manufacturing the phase-shifting photomask, the portions of the top surface of the light shielding layer exposed by the two opposite sidewalls of the hard-shielding layer pattern have the same width. As such, the problem of misalignment resulting from twice patterning can be avoided. On the other hand, the etching selectivity ratio of the hard-shielding layer pattern to the thermal oxide layer is good, therefore, the hard-shielding layer pattern can still maintain good pattern accuracy after the thermal oxide layer is removed.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection). For example, the electrical connection may include a general connection of wired connection as described above, or an interface connection through MIPI.

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 1A:
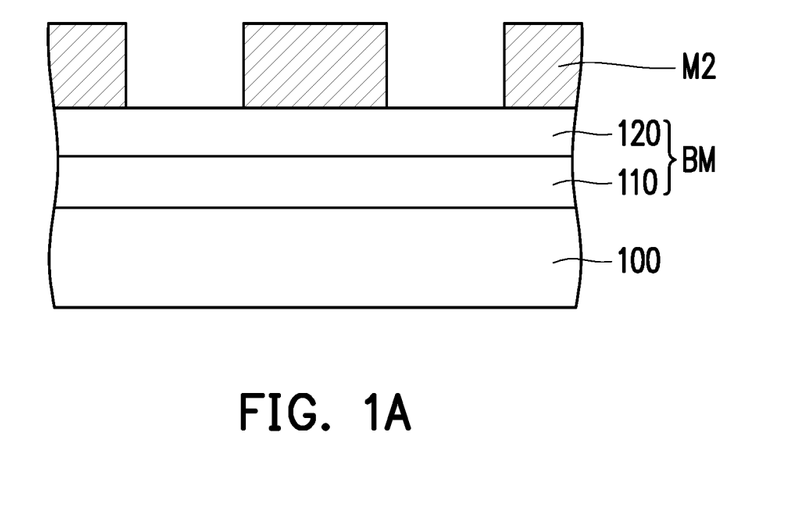
FIGS. 1A to 1F are cross-sectional views of the method of manufacturing the phase-shifting photomask according to an embodiment of the invention.

FIGS. 1A to 1F are cross-sectional views of the method of manufacturing the phase-shifting photomask according to an embodiment of the invention. FIG. 2 is a cross-sectional view of the phase-shifting photomask according to an embodiment of the invention.

Figure 1B:
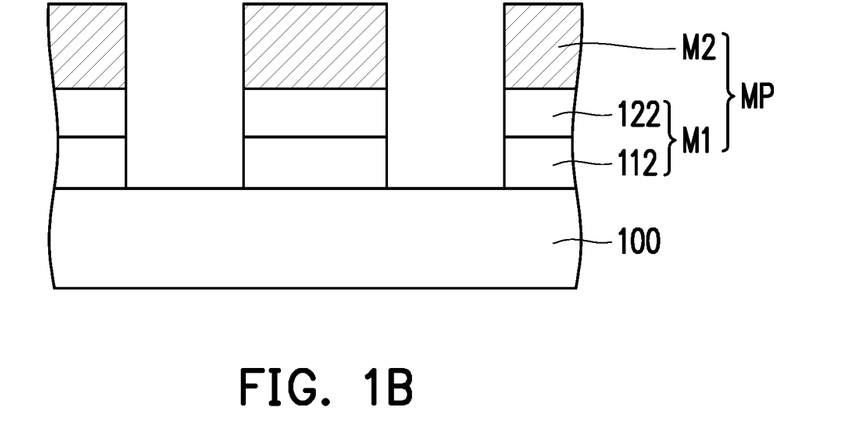
Figure 2:
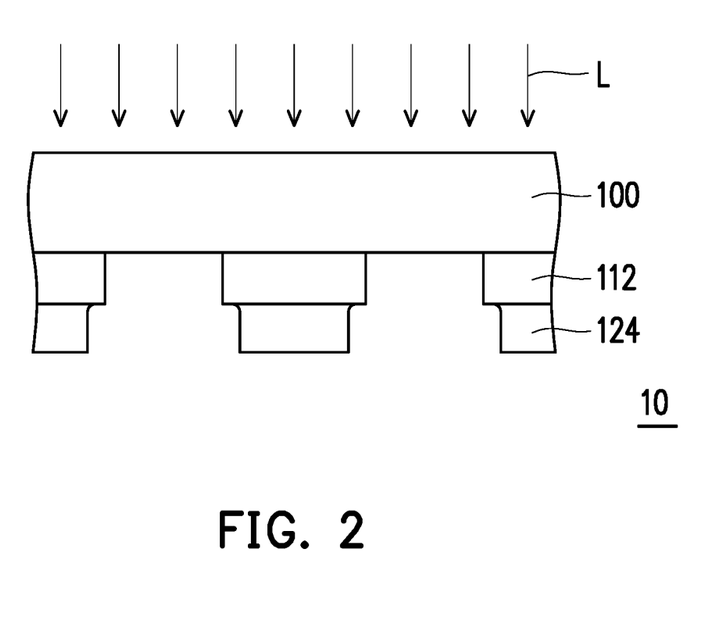
FIG. 2 is a cross-sectional view of the phase-shifting photomask according to an embodiment of the invention.

First, referring to FIG. 1B, a mask pattern MP is provided on a transparent substrate 100, wherein the mask pattern MP may include a first layer photomask pattern M1 and a second layer photomask pattern M2 stacked on the transparent substrate 100 in sequence, and the first layer photomask pattern M1 may include a phase-shifting layer 112 and a light shielding layer 122 stacked on the transparent substrate 100. In the present embodiment, the sidewall of the first layer photomask pattern M1 is coplanar with the sidewall of the second layer photomask pattern M2.

In some embodiments, as shown in FIGS. 1A and 1B, the steps of providing the mask pattern MP on the transparent substrate 100 may include: (1) providing a blank mask BM on the transparent substrate 100, wherein the blank mask BM may include a phase-shifting material layer 110 and a light shielding material layer 120 stacked on the transparent substrate 100; (2) forming a second layer photomask pattern M2 on the light shielding material layer 120; and (3) patterning the blank mask BM by using the second layer photomask pattern M2 as a mask to form a first layer photomask pattern M1 exposed the transparent substrate 100. In some embodiments, the method of forming the second layer photomask pattern M2 on the light shielding material layer 120 may include following steps. First, a second mask material layer (not illustrated) is formed on the light shielding material layer 120. Next, a patterned photoresist is formed on the second mask material layer. Then, the second mask material layer is patterned by using the patterned photoresist as a mask to form the second layer photomask pattern M2. After that, the patterned photoresist is removed.

In the preset embodiment, the transparent substrate 100 may include a material having a transmittance of about 100%, such as quartz glass. The phase-shifting layer 112 may include a material having a transmittance ranging from about 6% to 30% and a phase shift of 180°, such as MoSi. The light shielding layer 122 may include a material having a transmittance of about 0% and a phase shift of 0°, such as Cr. The material of the second layer photomask pattern M2 may include Si.

Figure 1C:
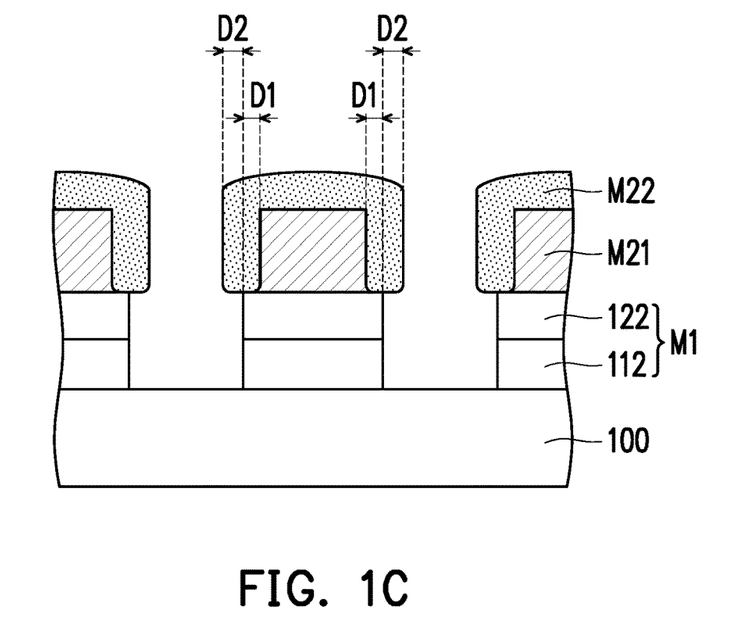

Next, referring to FIGS. 1B and 1C, a thermal oxidation process is performed on the second layer photomask pattern M2 to form a hard-shielding layer pattern M21 and a thermal oxide layer M22. Since portions of the second layer photomask pattern M2 adjacent to the top surface and the side surface thereof are oxidized through the thermal oxidation process, the thermal oxide layer M22 may include a portion that formed of the above oxidized portions of the second layer photomask pattern M2 and another portion that grown on the above oxidized portions of the second layer photomask pattern M2. Therefore, the size of the hard-shielding layer pattern M21 is smaller than the size of the second layer photomask pattern M2. As such, the hard-shielding layer pattern M21 may expose a portion of the top surface of the light shielding layer 122, and the thermal oxide layer M22 may cover the surface of the hard-shielding layer pattern M21 and the portion of the top surface of the light shielding layer 122. That is, the sidewall of the first layer photomask pattern M1 is at a first distance D1 from the corresponding sidewall of the hard-shielding layer pattern M21; and the sidewall of the first layer photomask pattern M1 is at a second distance D2 from the corresponding sidewall of the thermal oxide layer M22, and the sum of the first distance D1 and the second distance D2 is approximately equal to a thickness of the thermal oxide layer M22. In some embodiments, $O_2$ or $H_2O$ may be used, for example, to perform the thermal oxidation process, but the invention is not limited thereto.

Figure 1D:
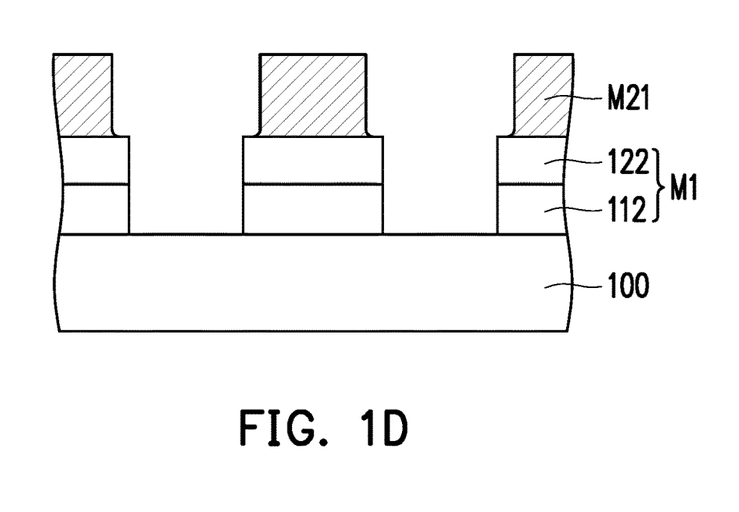

Then, referring to FIGS. 1C and 1D, the thermal oxide layer M22 is removed. In the present embodiment, the etching selectivity ratio of the thermal oxide layer M22 to the hard-shielding layer pattern M21 may be larger than 10. As such, the hard-shielding layer pattern M21 can still maintain good pattern accuracy after the step of removing the thermal oxide layer. In the present embodiment, the wet etch or dry etch may be used to remove the thermal oxide layer M22. Hereinafter, the material of the second layer photomask pattern M2 is Si as an exemplary embodiment for description, but the invention is not limited thereto. As the material of the second layer photomask pattern M2 is Si, the materials of hard-shielding layer pattern M21 and the thermal oxide layer M22 may be formed of Si and $SiO_2$ respectively after the thermal oxidation process is performed on the second layer photomask pattern M2. In the thermal oxidation process, the ratio of the Si consumption to the $SiO_2$ generation at the portions of the second layer photomask pattern M2 adjacent to the surface may be about 1:2.2, and the etching selectivity ratio of $SiO_2$ to Si may be greater than 10.

Based on the above, since the hard-shielding layer pattern M21 and the thermal oxide layer M22 are formed by performing the thermal oxidation process on the second layer photomask pattern M2, the portions of the top surface of the light shielding layer 122 exposed by the two opposite sidewalls of the hard-shielding layer pattern M21 may have the same width (i.e., first distance DD. As such, there is no need to perform another patterning process on the second layer photomask pattern M2, therefore, the problem of misalignment resulting from twice patterning can be avoided. On the other hand, the etching selectivity ratio of the hard-shielding layer pattern M21 to the thermal oxide layer M22 is good, therefore, the hard-shielding layer pattern M21 can still maintain good pattern accuracy after the thermal oxide layer M22 is removed.

Figure 1E:
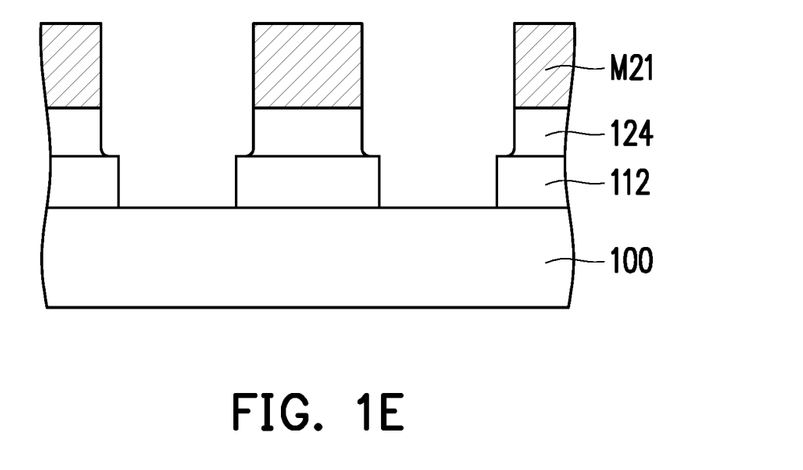

After that, referring to FIGS. 1D and 1E, a portion of the light shielding layer 122 is removed by using the hard-shielding layer pattern M21 as a mask to form a patterned light shielding layer 124 exposed the phase-shifting layer 112. Next, referring to FIGS. 1E and 1F, the hard-shielding layer pattern M21 is removed to form a phase-shifting photomask 10 (as shown in FIG. 2). In the present embodiment, the hard-shielding layer pattern M21 formed by the above thermal oxidation process can avoid the problem of misalignment resulting from twice patterning, and the hard-shielding layer pattern M21 can still maintain good pattern accuracy after the step of removing the thermal oxide layer M22. Therefore, the patterned light shielding layer 124 may also have good pattern accuracy because it is formed by using the hard-shielding layer pattern M21 as a mask. As such, the width of the phase-shifting layer 112 exposed by the patterned light shielding layer 124 at the surrounding is consistence. Accordingly, the process stability of the phase-shifting photomask 10 may be good. In the present embodiment, the phase-shifting photomask 10 may be a rim phase-shifting photomask, but the invention is not limited thereto. The exposure process performed by using the phase-shifting photomask 10 can improve the resolution of the exposure. For example, as shown in FIG. 2, the light L used in the exposure process may irradiate to the surface of the transparent substrate 100 away from the phase-shifting layer 112, and the phase-shifting layer 112 exposed by the patterned light shielding layer 124 at the surrounding thereof may improve the image contrast so as to increase the resolution of the exposure.

FIGS. 3A to 3E are cross-sectional views of the method of manufacturing the phase-shifting photomask according to another embodiment of the invention. The process of manufacturing a phase-shifting photomask 20 is similar to the process of manufacturing the phase-shifting photomask 10, the difference is at the step of forming the first layer photomask pattern, therefore, the same or similar components use the same or similar reference numerals, the connection relationships, materials and processes of the components have been described in detail in the foregoing, so they will not be repeated hereafter.

Figure 3A:
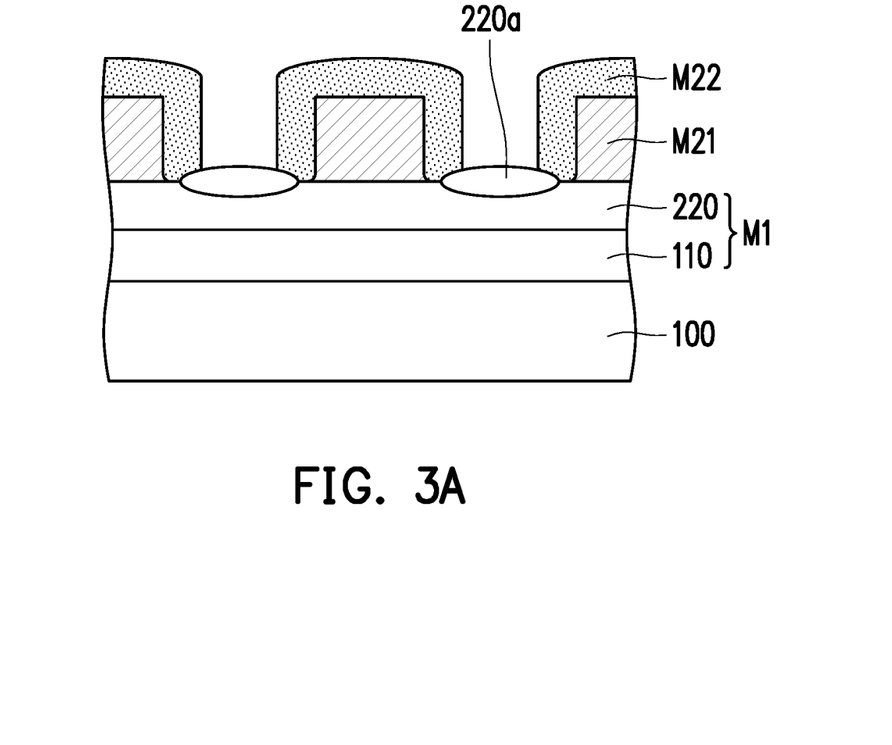
FIGS. 3A to 3E are cross-sectional views of the method of manufacturing the phase-shifting photomask according to another embodiment of the invention.

First, referring to FIGS. 1A and 3A, a blank mask BM is provided on a transparent substrate 100, wherein the blank mask BM may include a phase-shifting material layer 110 and a light shielding material layer 120 stacked on the transparent substrate 100 in sequence. Next, a second layer photomask pattern M2 is formed on the light shielding material layer 120. Then, a thermal oxidation process is performed on the second layer photomask pattern M2 and the light shielding material layer 120 to form a hard-shielding layer pattern M21, a first thermal oxide layer M22, and a second thermal oxide layer 220a, wherein the first thermal oxide layer M22 may be formed on the top surface and sidewall of the hard-shielding layer pattern M21, and the second thermal oxide layer 220a may be formed on the light shielding material layer 120 exposed by the second layer photomask pattern M2, for instance, the second thermal oxide layer 220a may be formed on the light shielding material layer 220 exposed by the first thermal oxide layer M22 and/or between the light shielding material layer 220 and the first thermal oxide layer M22. For example, since portions of the second layer photomask pattern M2 adjacent to the top surface and the side surface and portions of the light shielding material layer 120 exposed by the second layer photomask pattern M2 are oxidized through the thermal oxidation process, the first thermal oxide layer M22 may include a portion that formed of the above portions of the second layer photomask pattern M2 and another portion that formed on the above portions of the second layer photomask pattern M2; and the second thermal oxide layer 220a may include a portion that formed of the above portions of the light shielding material layer 120 and another portion that formed on the above portions of the light shielding material layer 120. Therefore, the size of the hard-shielding layer pattern M21 is smaller than the size of the second layer photomask pattern M2. In some embodiments, a portion of the second thermal oxide layer 220a may be formed between the light shielding material layer 220 and the first thermal oxide layer M22.

Figure 3B:
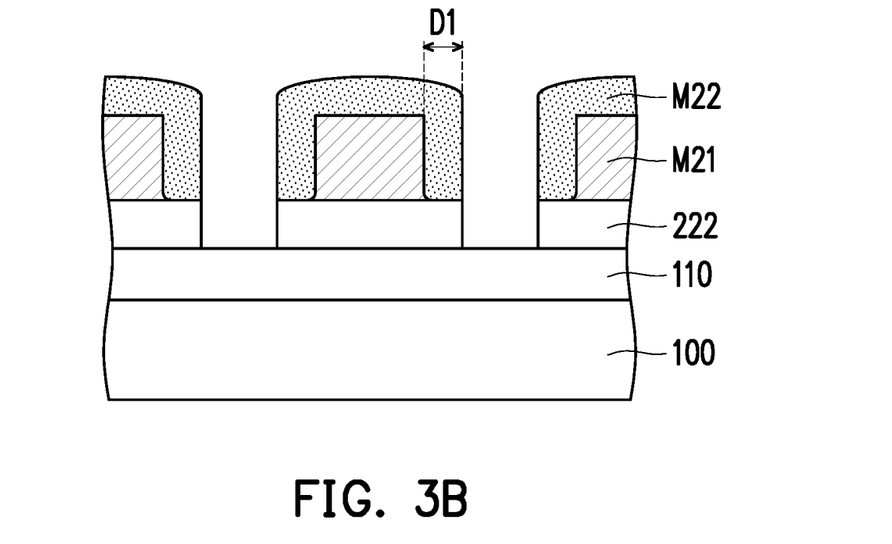

Next, referring to FIGS. 3A and 3B, the second thermal oxide layer 220a and a portion of the light shielding material layer 220 are removed to form a light shielding layer 222 exposed the phase-shifting material layer 110. In the present embodiment, the hard-shielding layer pattern M21 may expose a portion of a top surface of the light shielding layer 222, and the first thermal oxide layer M22 may cover the surface of the hard-shielding layer pattern M21 and the above portion of the top surface of the light shielding layer 222. In some embodiments, the second thermal oxide layer 220a and the portion of the light shielding material layer 220 may be removed by using an anisotropic etching process. For example, a dry etching process may be performed on the second thermal oxide layer 220a and the light shielding material layer 220 by using the first thermal oxide layer M22 as an etching mask to form the light shielding layer 222 exposed the phase-shifting material layer 110. As such, the sidewall of the first thermal oxide layer M22 is coplanar with the sidewall of the light shielding layer 222, and the sidewall of the light shielding layer 222 is at a first distance from the sidewall of the hard-shielding layer pattern M21, and the first distance D1 is approximately equal to a thickness of the first thermal oxide layer M22. In some other embodiments, the second thermal oxide layer 220a and the portion of the light shielding material layer 220 may be removed by using an isotropic etching process. For example, a wet etching process may be performed on the second thermal oxide layer 220a and the light shielding material layer 220 by using the first thermal oxide layer M22 as an etching mask to form the light shielding layer 222 exposed the phase-shifting material layer 110. As such, the sidewall of the light shielding layer 222 is at a first distance (not illustrated) from the sidewall of the hard-shielding layer pattern M21; and the sidewall of the first thermal oxide layer M22 is at a second distance (not illustrated) from the sidewall of the light shielding layer 222, and the sum of the first distance and the second distance is approximately equal to a thickness of the first thermal oxide layer M22. In some embodiments, in the step of removing the second thermal oxide layer 220a and the portion of the light shielding material layer 220, a portion of the phase-shifting material layer 110 exposed by the light shielding layer 222 may be removed (e.g., over-etching) to ensure that the light shielding material layer 220 is not remained on a region of the phase-shifting material layer 110 exposed by the light shielding layer 222.

Figure 3C:
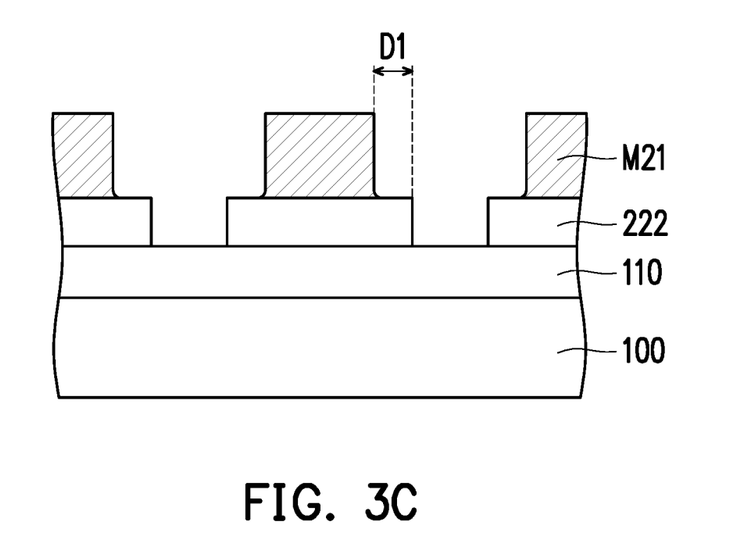

Then, referring to FIGS. 3B and 3C, the first thermal oxide layer M22 is removed. In the present embodiment, since the phase-shifting material layer 110 still covers on the transparent substrate 100, the damage on the transparent substrate 100 can be avoided during the process of removing the first thermal oxide layer M22.

Figure 3D:
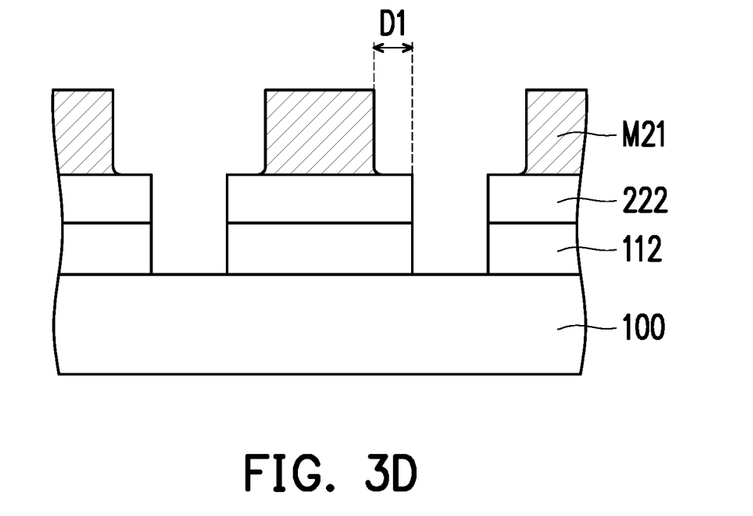

After that, referring to FIGS. 3C and 3D, a portion of the phase-shifting material layer 110 is removed by using the light shielding layer 222 as a mask to form a phase-shifting layer 112 exposed the transparent substrate 100. Even a portion of the phase-shifting material layer 110 may be removed resulting from the over-etching in the step of forming the light shielding layer 222, it will not affect the subsequent processes because the over-etched portion of the phase-shifting material layer 110 will be removed in the step of forming the phase-shifting layer 112. In the present embodiment, the sidewall of the light shielding layer 222 is coplanar with the sidewall of the phase-shifting layer 112.

Figure 1F:
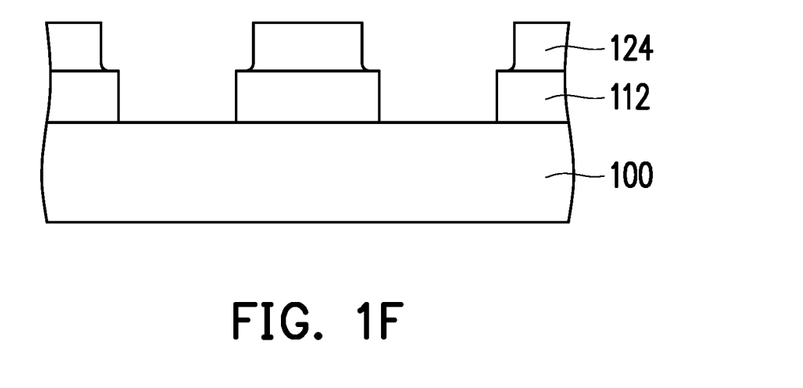
Figure 3E:
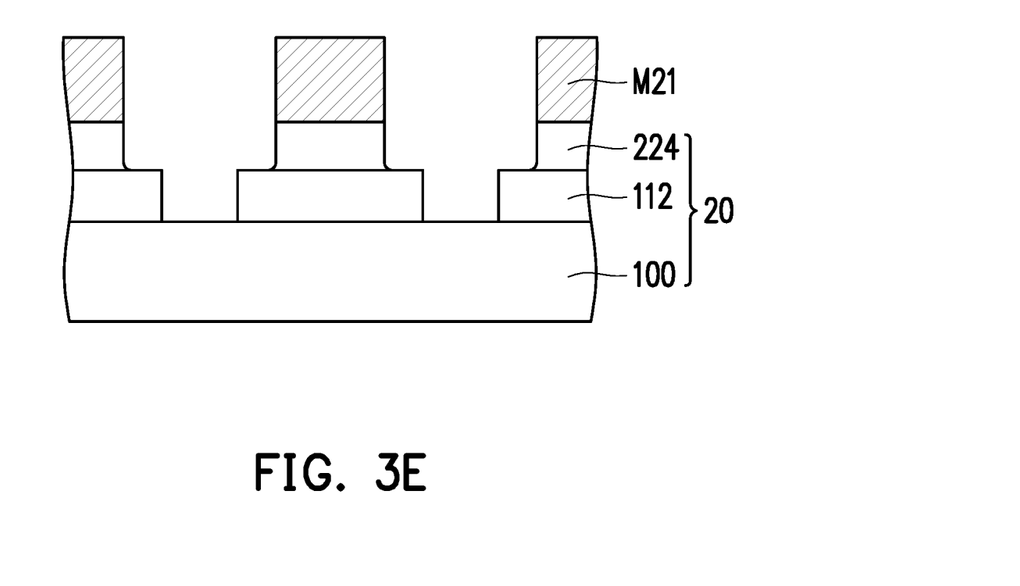

Then, referring to FIGS. 3D and 3E, a portion of the light shielding layer 222 is removed by using the hard-shielding layer pattern M21 as a mask to form a patterned light shielding layer 224 exposed the phase-shifting layer 112. After that, proceeding the same process as shown in FIG. 1F, the hard-shielding layer pattern M21 is removed to form a phase-shifting photomask 20.

FIGS. 4A to 4E are cross-sectional views of the method of manufacturing the phase-shifting photomask according to still another embodiment of the invention. The process of manufacturing a phase-shifting photomask 30 is similar to the process of manufacturing the phase-shifting photomask 10, the difference is at the step of removing the thermal oxide layer, therefore, the same or similar components use the same or similar reference numerals, the connection relationships, materials and processes of the components have been described in detail in the foregoing, so they will not be repeated hereafter.

Figure 4A:
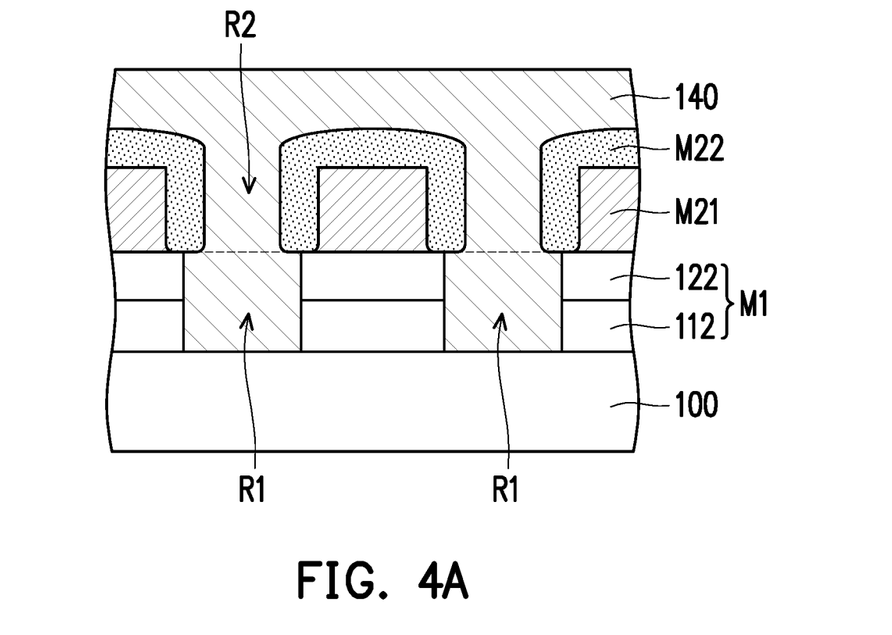
FIGS. 4A to 4E are cross-sectional views of the method of manufacturing the phase-shifting photomask according to still another embodiment of the invention.
Figure 4B:
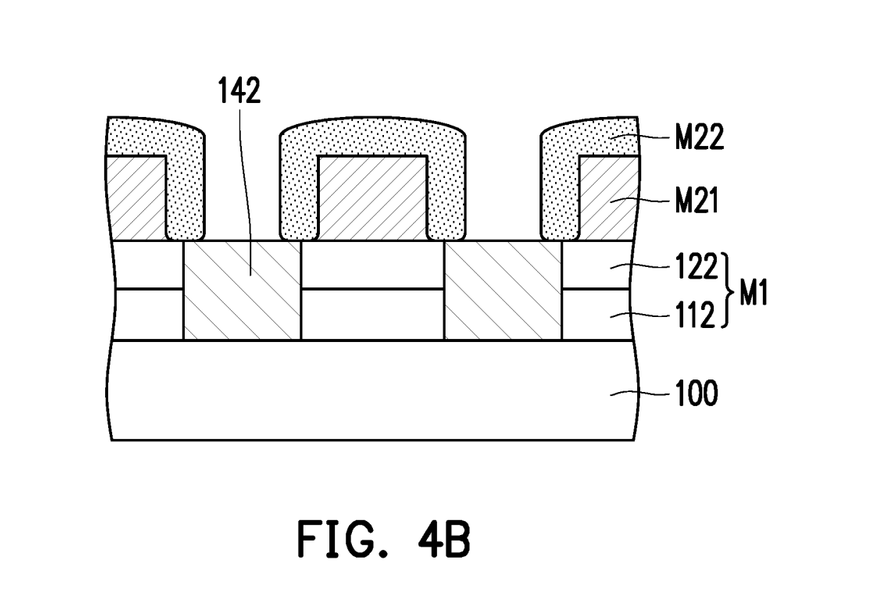

First, referring to FIGS. 1C and 4B, a photoresist pattern 142 is formed on the transparent substrate 100 before the thermal oxide layer M22 is removed. The photoresist pattern 142 may cover the transparent substrate 100 exposed by the first layer photomask pattern M1. In the present embodiment, the photoresist pattern 142 may be formed in the gap between the first layer photomask pattern M1 exposed the transparent substrate 100. The height of the photoresist pattern 142 may be adjusted according to the exposure parameters, as long as the thermal oxide layer M22 is exposed. Referring to FIG. 4A, in the present embodiment, the steps of forming the photoresist pattern 142 may include: (1) forming a photoresist layer 140 on the transparent substrate 100 to cover the thermal oxide layer M22, wherein the photoresist layer 140 may have a first region R1 located on the transparent substrate 100 exposed by the first layer photomask pattern M1 and a second region R2 located on the first region R1 and covered the top surface and sidewalls of the thermal oxide layer M22; and (2) removing the second region R2 of the photoresist layer 140 to form the photoresist pattern 142. In the present embodiment, the method of removing the second region R2 of the photoresist layer 140 may be, for example, by adjusting the depth of the exposure, so that the second region R2 of the photoresist layer 140 is exposed, and the first region R1 of the photoresist layer 140 is not exposed. As such, there is no need to provide another photomask to form the photoresist pattern 142.

Figure 4C:
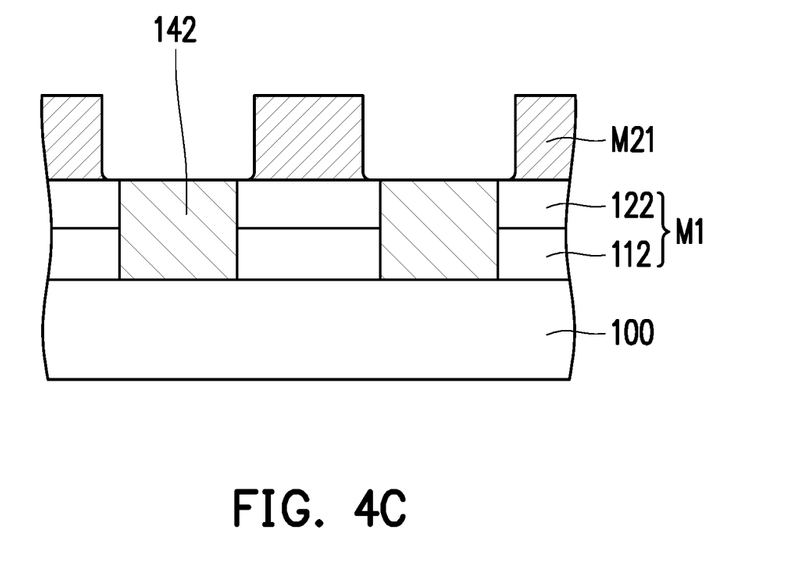

Next, referring to FIGS. 4B and 4C, the thermal oxide layer M22 is removed. In the present embodiment, since the photoresist pattern 142 still covers on the transparent substrate 100, the damage on the transparent substrate 100 can be avoided during the process of removing the thermal oxide layer M22.

Figure 4D:
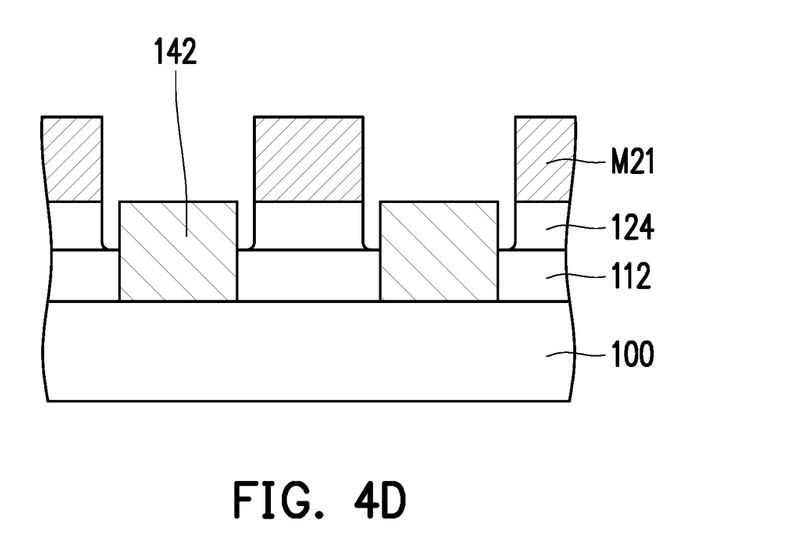

Then, referring to FIGS. 4C and 4D, a portion of the light shielding layer 122 is removed by using the hard-shielding layer pattern M21 and the photoresist pattern 142 as a mask to form a patterned light shielding layer 124 exposed the phase-shifting layer 112. That is the photoresist pattern 142 can be removed after the patterned light shielding layer 124 is formed, but the invention is not limited thereto. In other embodiments, the photoresist pattern 142 can be removed after the thermal oxide layer M22 is removed. For example, a portion of the light shielding layer 122 may be removed by using the hard-shielding layer pattern M21 as a mask to form a patterned light shielding layer 124 exposed the phase-shifting layer 112 after the photoresist pattern 142 is removed.

Figure 4E:
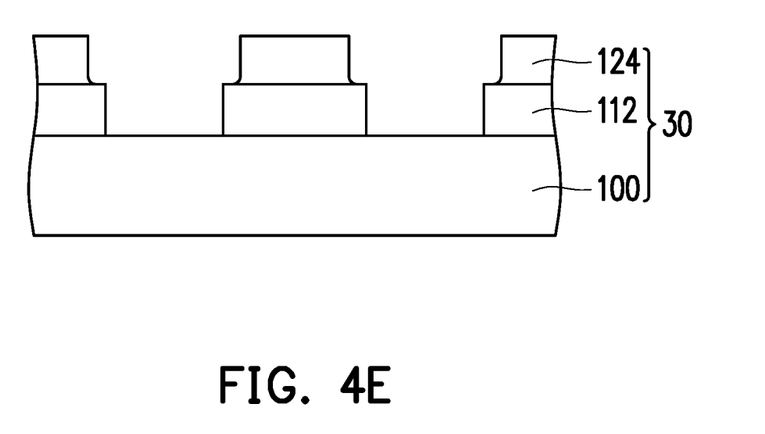

After that, referring to FIGS. 4D and 4E, the hard-shielding layer pattern M21 and the photoresist pattern 142 are removed to form a phase-shifting photomask 30.

In view of the above, since the hard-shielding layer pattern is formed by performing the thermal oxidation process on the second layer photomask pattern in the above embodiments of the method for manufacturing the phase-shifting photomask, the portions of the top surface of the light shielding layer exposed by the two opposite sidewalls of the hard-shielding layer pattern have the same width. As such, the problem of misalignment resulting from twice patterning can be avoided. On the other hand, the etching selectivity ratio of the hard-shielding layer pattern to the thermal oxide layer is good, therefore, the hard-shielding layer pattern can still maintain good pattern accuracy after the thermal oxide layer is removed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method of manufacturing a phase-shifting photomask, comprising:
   providing a mask pattern on a transparent substrate, wherein the mask pattern comprises a first layer photomask pattern and a second layer photomask pattern stacked on the transparent substrate in sequence, and the second layer photomask pattern comprises a hard-shielding layer pattern, and the first layer photomask pattern comprises a phase-shifting layer and a light shielding layer stacked on the transparent substrate in sequence;
   performing a thermal oxidation process on the second layer photomask pattern to form a thermal oxide layer on the hard-shielding layer pattern, wherein the hard-shielding layer pattern covers a first portion of a top surface of the light shielding layer, and the thermal oxide layer covers a surface of the hard-shielding layer pattern and a second portion of the top surface of the light shielding layer;
   removing the thermal oxide layer;
   removing the second portion of the light shielding layer by using the hard-shielding layer pattern as a mask to form a patterned light shielding layer where the phase-shifting layer below the second portion is exposed; and
   removing the hard-shielding layer pattern.

2. The method of manufacturing the phase-shifting photomask according to claim 1, wherein the sidewall of the first layer photomask pattern is coplanar with the sidewall of the second layer photomask pattern.

3. The method of manufacturing the phase-shifting photomask according to claim 1, wherein the sidewall of the first layer photomask pattern is at a first distance from the sidewall of the hard-shielding layer pattern.

4. The method of manufacturing the phase-shifting photomask according to claim 3, wherein the sidewall of the thermal oxide layer is at a second distance from the sidewall of the first layer photomask pattern.

5. The method of manufacturing the phase-shifting photomask according to claim 4, wherein the sum of the first distance and the second distance is approximately equal to a thickness of the thermal oxide layer.

6. The method of manufacturing the phase-shifting photomask according to claim 1, wherein an etching selectivity ratio of the thermal oxide layer to the hard-shielding layer pattern is larger than 10.

7. The method of manufacturing the phase-shifting photomask according to claim 6, wherein the material of the hard-shielding layer pattern comprises silicon, and the material of the thermal oxide layer comprises silicon oxide.

8. The method of manufacturing the phase-shifting photomask according to claim 1, wherein the steps of providing the mask pattern on the transparent substrate comprise:
   providing a blank mask on the transparent substrate, wherein the blank mask comprises a phase-shifting material layer and a light shielding material layer stacked on the transparent substrate in sequence;
   forming the second layer photomask pattern comprising the hard-shielding layer pattern on the light shielding material layer; and
   patterning the blank mask by using the second layer photomask pattern as a mask to form the first layer photomask pattern exposed the transparent substrate.

9. The method of manufacturing the phase-shifting photomask according to claim 1, wherein the light transmittance of the phase-shifting layer is ranging from about 6% to 30%.

10. The method of manufacturing the phase-shifting photomask according to claim 1, further comprising:
    forming a photoresist pattern on the transparent substrate before removing the thermal oxide layer, wherein the photoresist pattern covers the transparent substrate exposed by the first layer photomask pattern; and
    removing the photoresist pattern after the thermal oxide layer is removed.

11. The method of manufacturing the phase-shifting photomask according to claim 10, wherein the steps of forming the photoresist pattern comprise:
    forming a photoresist layer covered the thermal oxide layer on the transparent substrate, wherein the photoresist layer has a first region covering the transparent substrate exposed by the first layer photomask pattern and a second region disposed on the first region and covering the top surface and sidewalls of the thermal oxide layer; and removing the second region of the photoresist layer to form the photoresist pattern.

12. The method of manufacturing the phase-shifting photomask according to claim 10, wherein the photoresist pattern is removed after the patterned light shielding layer is formed.

13. A method of manufacturing a phase-shifting photomask, comprising:
providing a blank mask on a transparent substrate, wherein the blank mask comprises a phase-shifting material layer and a light shielding material layer stacked on the transparent substrate in sequence;
forming a second layer photomask pattern comprising a hard-shielding layer pattern on the blank mask;
performing a thermal oxidation process on the second layer photomask pattern and the light shielding material layer to form a first thermal oxide layer formed on the top surface and sidewalls of the hard-shielding layer pattern, and a second thermal oxide layer formed on the light shielding material layer exposed by the second layer photomask pattern;
removing the second thermal oxide layer and a portion of the light shielding material layer to form a light shielding layer where the phase-shifting material layer below the second thermal oxide layer formed on the sidewalls of the patterned light shielding layer is exposed;
removing the first thermal oxide layer;
removing a portion of the phase-shifting material layer by using the light shielding layer as a mask to form a phase-shifting layer exposed the transparent substrate;
removing a portion of the light shielding layer by using the hard-shielding layer pattern as a mask to form a patterned light shielding layer exposed the phase-shifting layer; and
removing the hard-shielding layer pattern.

14. The method of manufacturing the phase-shifting photomask according to claim 13, wherein the sidewall of the light shielding layer is coplanar with the sidewall of the phase-shifting layer.

15. The method of manufacturing the phase-shifting photomask according to claim 13, wherein the sidewall of the light shielding layer is coplanar with the sidewall of the first thermal oxide layer.

16. The method of manufacturing the phase-shifting photomask according to claim 15, wherein the sidewall of the hard-shielding layer pattern is at a first distance from the sidewall of the light shielding layer.

17. The method of manufacturing the phase-shifting photomask according to claim 16, wherein the first distance is approximately equal to a thickness of the first thermal oxide layer.

18. The method of manufacturing the phase-shifting photomask according to claim 13, wherein the sidewall of the light shielding layer is at a first distance from the sidewall of the hard-shielding layer pattern.

19. The method of manufacturing the phase-shifting photomask according to claim 18, wherein the sidewall of the first thermal oxide layer is at a second distance from the sidewall of the light shielding layer.

20. The method of manufacturing the phase-shifting photomask according to claim 19, wherein the sum of the first distance and the second distance is approximately equal to a thickness of the first thermal oxide layer.

* * * * *